(12) United States Patent
Kang

(10) Patent No.: US 8,143,785 B2
(45) Date of Patent: Mar. 27, 2012

(54) PLASMA DISPLAY DEVICE HAVING AN ANISOTROPIC CONDUCTIVE FILM

(75) Inventor: Tae-Kyoung Kang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 129 days.

(21) Appl. No.: 12/398,091

(22) Filed: Mar. 4, 2009

(65) Prior Publication Data

US 2009/0224670 A1    Sep. 10, 2009

(30) Foreign Application Priority Data

Mar. 7, 2008    (KR) .................. 10-2008-0021483

(51) Int. Cl.
    *H01J 17/49*    (2006.01)
(52) U.S. Cl. .................. 313/582; 361/679.01
(58) Field of Classification Search .................. 313/582; 345/60; 361/719, 704, 679.01, 679.27; 349/150
See application file for complete search history.

(56) References Cited

U.S. PATENT DOCUMENTS

| | | | |
|---|---|---|---|
| 2005/0110406 A1* | 5/2005 | Jeong et al. .................. | 313/582 |
| 2006/0103595 A1* | 5/2006 | Kim et al. .................. | 345/60 |
| 2008/0106494 A1* | 5/2008 | Chung .................. | 345/60 |
| 2008/0151170 A1* | 6/2008 | Oh et al. .................. | 349/149 |
| 2008/0238826 A1* | 10/2008 | Kang .................. | 345/64 |
| 2009/0033225 A1* | 2/2009 | Kang .................. | 313/583 |

FOREIGN PATENT DOCUMENTS

| | | |
|---|---|---|
| KR | 10-2001-0083972 A | 9/2001 |
| KR | 10-2005-0001917 A | 1/2005 |
| KR | 10-2007-0081708 | 8/2007 |
| KR | 10-2008-0057880 A | 6/2008 |

OTHER PUBLICATIONS

SIPO Office action dated Feb. 23, 2011, for corresponding Chinese Patent application 200910126241.X, with English translation, 8 pages.

* cited by examiner

*Primary Examiner* — Karabi Guharay
(74) *Attorney, Agent, or Firm* — Christie, Parker & Hale, LLP

(57) ABSTRACT

A plasma display device includes a plasma display panel for displaying an image by a gas discharge. A chassis base is attached to the plasma display panel and supports the plasma display panel. At least one printed circuit board is mounted on the a side of the chassis base at opposite the side supporting the plasma display panel. At least one flexible printed circuit connects electrodes of the plasma display panel and terminals of the printed circuit boards. An anisotropic conductive film is between the terminal of the printed circuit board and a terminal of the flexible printed circuit and connects the terminal of the printed circuit board and the terminal of the flexible printed circuit. The printed circuit board includes at least one dummy groove outside a region of the printed circuit board facing the flexible printed circuit.

11 Claims, 6 Drawing Sheets

PLASMA DISPLAY DEVICE HAVING AN ANISOTROPIC CONDUCTIVE FILM

CROSS-REFERENCE TO RELATED APPLICATION

This application claims priority to and the benefit of Korean Patent Application No. 10-2008-0021483 filed in the Korean Intellectual Property Office on Mar. 7, 2008, the entire content of which is incorporated herein by reference.

BACKGROUND OF THE INVENTION

1. Field of the Invention

The present invention relates to plasma display devices, and, more particularly, to connections between printed circuit boards (PCBs) and flexible printed circuits (FPCs) in plasma display devices.

2. Description of the Related Art

Generally, a plasma display device includes a plasma display panel (PDP) for displaying an image, a chassis base attached to and supporting the PDP, and a plurality of PCBs mounted on the chassis base and connected to the PDP.

The PDP generates plasma through gas discharge, excites phosphors with vacuum ultraviolet (VUV) rays radiated from the plasma, and displays images by using visible light of red R, green G, and blue B colors generated as the excited phosphors become stable.

The PDP has address electrodes and display electrodes (e.g., sustain electrodes and scan electrodes) crossing each other, the crossing points corresponding to discharge cells. The address electrodes and display electrodes are connected to the related PCBs, respectively, via flexible FPCs.

The PCBs and the FPCs have terminals that are connected to each other via an anisotropic conductive film (ACF). That is, the ACF electrically connects the terminals of the PCBs and the terminals of the FPCs to thus enable the transmission of various voltage signals.

As the picture quality of the PDP becomes higher, the number of channels of the FPCs connected to the electrodes of the PDP increases. As a result, a stable pitch is obtained between the channels, and hence the width of the FPCs increases.

Accordingly, the FPCs can be more easily extended on the PCBs, and the ACF generates a difference in attachment force between regions facing the FPCs and regions outside the facing regions, thereby making it easier for the FPCs to separate from the PCBs.

That is, since the terminals of the FPCs and the terminals of the PCBs can be separated, the reliability of the connection of the PCBs to the FPCs (i.e., connection between the terminals of the FPCs and the terminals of the PCBs) is degraded.

SUMMARY OF THE INVENTION

In accordance with the present invention a plasma display device is provided in which the reliability of connections between PCBs and FPCs is improved.

Further, in accordance with the present invention a plasma display device is provided in which, more particularly, the reliability of connections between terminals of PCBs and terminals of FPCs is improved.

A plasma display device in accordance with one exemplary embodiment of the present invention includes a PDP for displaying an image by a gas discharge. A chassis base is attached to the PDP and supports the PDP. At least one PCB is mounted on the chassis base at opposite sides of the PDP. At least one FPC connects electrodes of the PDP and terminals of the PCBs. An ACF is between the terminal of the PCB and a terminal of the FPC and connects the terminal of the PCB and the terminal of the FPC. The PCB includes at least one dummy groove formed outside a region of the PCB facing the FPC.

The FPC may have a width formed along the terminal spacing direction of the terminals. The ACF may have a length that is greater longer than the width of the FPCs. One side of the ACF is attached at least to the dummy groove.

The dummy groove may have the same width as that of the terminal of the PCB.

There may be multiple FPCs. The terminal of the PCB may include at least a first terminal set and a second terminal set thereof so as to correspond to the multiple FPCs, respectively, and the dummy groove may include a plurality of dummy grooves formed between the first terminal set and the second terminal set.

The dummy groove may include at least one of a small width dummy groove having the same width as that of the terminals of the PCBs and a large width dummy groove having a larger width than that of the terminals of the PCBs.

The terminal of the PCB may include at least a first terminal set and a second terminal set so as to correspond to the plurality of FPCs, respectively, and the large width dummy groove may include a first large width dummy groove and a second large width dummy groove that are formed between the first terminal set and the second terminal set, neighboring the first terminal set and the second terminal set.

The ACF may include a first ACF disposed on the first terminal set and a second ACF disposed on the second terminal set, wherein neighboring ends of the first ACF and the second ACF are positioned between the first large width dummy groove and the second large width dummy groove.

The terminal of the PCB may include at least a first terminal set and a second terminal set so as to correspond to the plurality of FPCs, respectively, and the dummy groove may include an integral dummy groove formed integrally between the first terminal set and the second terminal set.

The ACF includes a first ACF disposed on the first terminal set and a second ACF disposed on the second terminal set, wherein neighboring ends of the first ACF and the second ACF are positioned at the integral dummy grooves.

The PDP may include address electrodes and display electrodes crossing each other, corresponding to the discharge cells in order to cause a gas discharge, the display electrodes may include sustain electrodes and scan electrodes that are parallel to each other. The electrodes connected to the FPC may be the address electrodes, the PCB may be an address buffer board, and the FPC may be formed of a TCP.

The PDP includes address electrodes and display electrodes crossing each other, corresponding to the discharge cells in order to cause a gas discharge, the display electrodes include sustain electrodes and scan electrodes that are in parallel to each other. The electrodes connected to the FPC may be the sustain electrodes or the scan electrodes, and the PCB may be a sustain board connected to the sustain electrodes or a scan board connected to the scan electrodes.

DETAILED DESCRIPTION OF THE EMBODIMENTS

Figure 1:
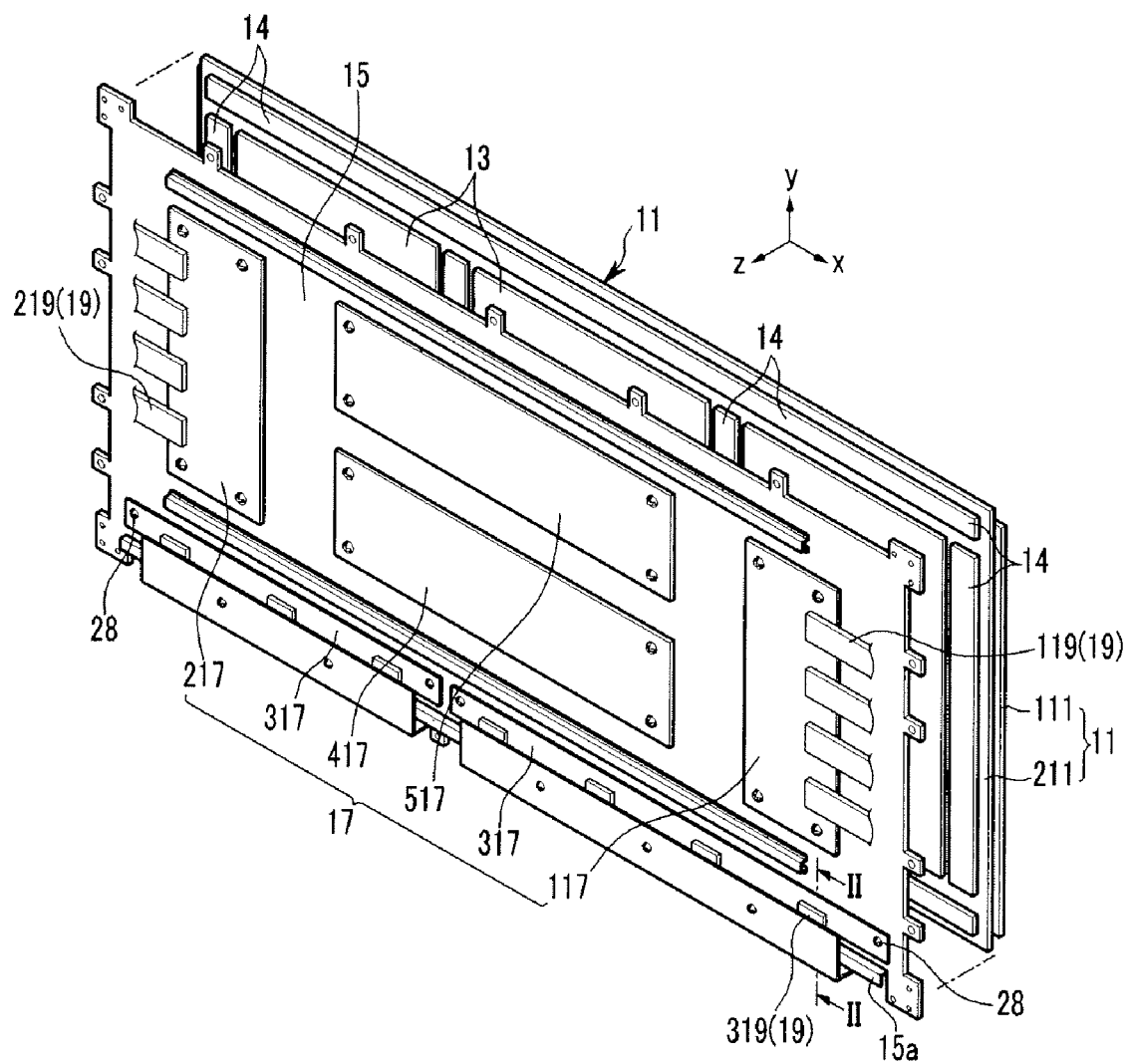
FIG. 1 is a partially exploded perspective view schematically illustrating a plasma display device in accordance with a first exemplary embodiment of the present invention.
Figure 2:
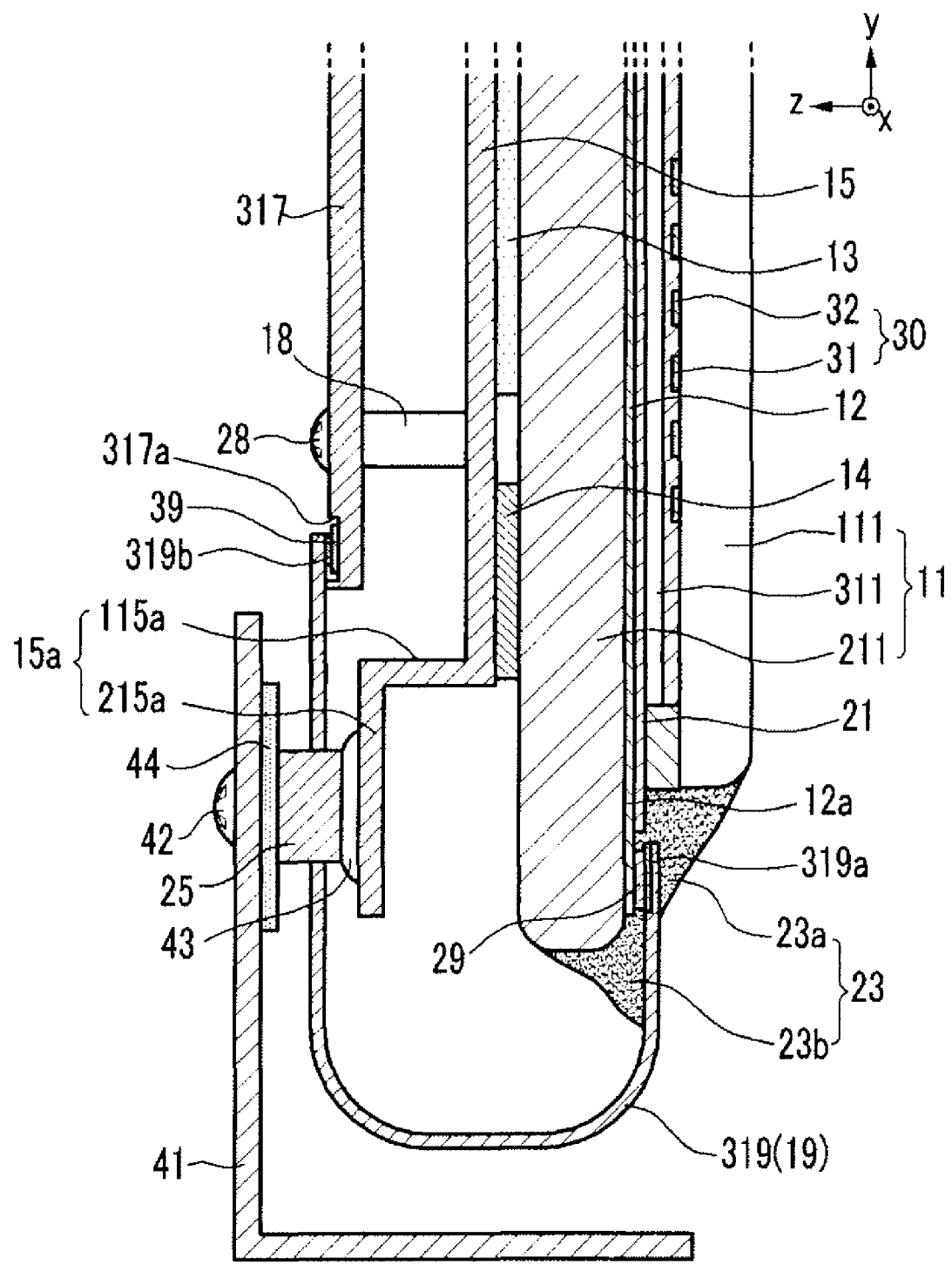
FIG. 2 is a cross-sectional view taken along line II-II of FIG. 1.

Referring to FIGS. 1 and 2, a plasma display device includes a PDP 11 for displaying an image by a gas discharge, heat dissipation sheets 13, a chassis base 15, PCBs 17, and FPCs 19.

The exemplary embodiment of the present invention involves the coupling relationship between the PDP 11 and other components. Therefore, a detailed description of the PDP 11 will be omitted herein, and the portions required for the description of this embodiment will be partly explained.

The PDP 11 includes address electrodes 12 and display electrodes 30 disposed corresponding to discharge cells 311 in order to generate a gas discharge in the discharge cells 311 formed between a front substrate 111 and a rear substrate 211.

The address electrodes 12 and the display electrodes 30 cross each other at points corresponding to the discharge cells 311 so as to select a discharge cell 311 to be turned on. The display electrodes 30 include sustain electrodes 31 and scan electrodes 32 disposed in parallel so as to implement an image in the selected discharge cell 311.

The address electrodes 12 extend in a first direction (y-axis direction), and the sustain electrodes 31 and the scan electrodes 32 extend in a second direction (x-axis direction) crossing the first direction.

The heat dissipation sheets 13 are provided on the rear surface of the PDP 11, and disperse the heat generated from the PDP 11 by a gas discharge to the plane of the PDP 11.

As examples, the heat dissipation sheets 13 may be made of various materials such as an acryl-based heat dissipation material, a graphite-based heat dissipation material, a metal heat dissipation material, and a carbon nanotube-based heat dissipation material.

The chassis base 15 is attached to the rear surface of the PDP 11 by double-sided tape 14, with the heat dissipation sheets 13 therebetween, and supports the PDP 11.

The PCBs 17 are mounted on the rear surface of the chassis base 15 and are electrically connected to the PDP 11 to thus drive the PDP 11.

The PCBs 17 are placed on a plurality of bosses 18 provided on the chassis base 15, and are fixed by screws 28, such as set screws, fastened to the bosses 18.

The PCBs 17 include multiple separate boards for performing their respective functions for driving the PDP 11.

For instance, the PCBs 17 include a sustain board 117 for controlling the sustain electrodes 31, a scan board 217 for controlling the scan electrodes 32, and an address buffer board 317 for controlling the address electrodes 12.

In addition, the PCBs 17 include an image processing and controlling board 417 receiving image signals from the outside and generating control signals required for driving the address electrodes 12 and control signals required for driving the sustain electrodes 31 and scan electrodes 32 and applying them to the corresponding board assemblies, and a power supply board 517 for supplying power required for driving boards 117, 217, 317, 417.

The FPCs 19 include a first FPC 119 connecting the sustain board 117 to the sustain electrodes 31, a second FPC 219 connecting the scan board 217 to the scan electrodes 32, and a third FPC 319 connecting the address buffer board 317 to the address electrode 12.

With regard to the present invention, a connection structure of the first FPC 119 and the sustain board 117, a connection structure of the second FPC 219 and the scan board 217, and a connection structure of the third FPC and the address buffer board 317 are similar or identical to each other.

First, referring to FIGS. 3 to 5, the connection structure of the third FPC 319 and the address buffer board 317 will be explained. The third FPC 319 is formed in a tape carrier package (TCP) type having a driver integrated circuit 25 mounted thereon, and the driver integrated circuit 25 is for generating control signals applied to the address electrodes 12.

Referring back to FIG. 2, the connection structure of the third FPC 319 and the address electrodes 12 will be explained. An ACF 29 is used for connecting the third FPC 319 and the address electrodes 12.

The ACF 29 conductively connects terminals 12a of the address electrodes 12 and portions facing first terminals 319a of the third FPC 319. When the third FPC 319 is pressed on the first terminals 319a, the ACF 29 electrically connects the terminals 12a of the address electrodes 12 and the first terminals 319a of the third FPC 319.

In addition, the plasma display device includes a sealing member 23 for sealing the first terminals 319a of the third FPC 319 and the terminals 12a of the address electrodes 12. The sealing member 23 includes a first sealing member 23a and a second sealing member 23b that are provided at positions deviating from each other at both sides thereof, with the third FPC 319 placed therebetween.

In one example, the first sealing member 23a is formed between an end portion of the third FPC 319 and an end of the front substrate 111 facing the end portion of the third FPC 319, and seals a gap between the third FPC 319 and the front substrate 111.

The second sealing member 23b is formed between end portions of the terminals 12a and the third FPC 319 facing the end portions of the terminals 12a, and seals a gap between the terminals 12a and the rear substrate 211 and the third FPC 319.

More specifically, the first sealing member 23a seals the end of a dielectric layer 21 covering the address electrodes 12, the top of the terminals 12a, and the end of the dielectric layer 21 of the ACF 29. In this way, portions of the terminals 12a exposed without being covered by both of the dielectric layer 21 and the ACF 29 are sealed.

In addition, the second sealing member 23b seals the ends of the terminals 12a and the end of the ACF 29 opposite to the dielectric layer 21. In this way, the end portions of the terminals 12a exposed between the rear substrate 211 and the third FPC 319 are sealed.

As a result, the terminals 12a of the address electrodes 12 are completely sealed by the first sealing member 23a, the second sealing member 23b, the rear substrate 211, and the third FPC 319.

The chassis base 15 is formed as a rectangle having a long side and a short side. The chassis base 15 has a bent reinforcing portion 15a on the long side. The reinforcing portion 15a includes a first bent portion 115a and a second bent portion 215a, and forms the end of the long side of the chassis base 15.

The first bent portion 115a is formed to be bent to the opposite side of the PDP 11 from the end of the longitudinal side of the chassis base 15. The second bent portion 215a is formed to be bent in parallel to the PDP 11, extending from the first bent portion 115a.

A cover plate 41 is mounted on the second bent portion 215a by a screw 42, such as a set screw. The driver integrated circuit 25 and the portion of the third flexible circuit 319 around the driver integrated circuit 25 are disposed between the second bent portion 215a and the cover plate 41.

Thermal grease 43 is interposed between the second bent portion 215a and the third flexible circuit 319, and a thermal conduction sheet 44 is interposed between the cover plate 41 and the third FPC 319.

The thermal grease 43 and the thermal conduction sheet 44 dissipate heat generated from the driver integrated circuit 25 and the third FPC 319 to the second bent portion 215a and the cover plate 41, respectively.

The third FPC 319 has second terminals 319b on the opposite side to that of the first terminals 319a, and is connected to the terminals 317a of the address buffer board 317 by the second terminals 319b.

An ACF 39 is also used for a connection structure of the second terminals 319b of the third FPC 319 and the terminals 317a of the address buffer board 317. The second terminals 319b and the terminals 317a are electrically connected to each other by conductive balls (not shown) provided on the ACF 39.

Since an ACF is used for a structure for electrically connecting terminals of a micropattern and other terminals, and a structure for forming a conduction path through which conductive balls pass between the terminals at both sides is a well-known art, a detailed description of the conductive ball arrangement structure for electrically connecting the second terminals 319b and the terminals 317a will be omitted.

Figure 3:
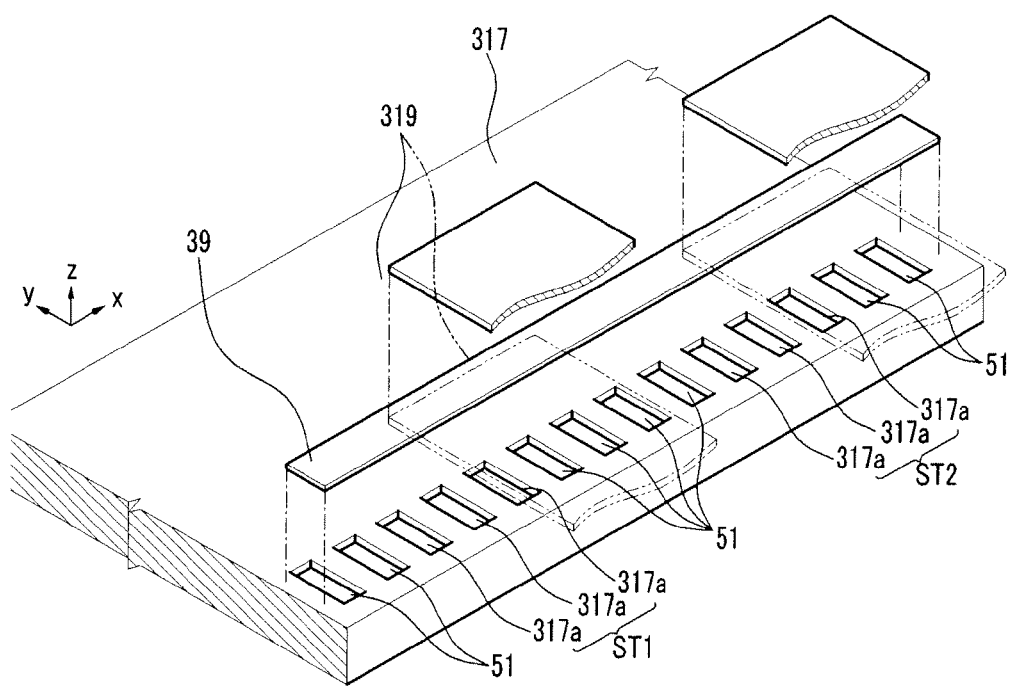
FIG. 3 is an exploded perspective view of a PCB, an ACF, and an FPC.
Figure 4:
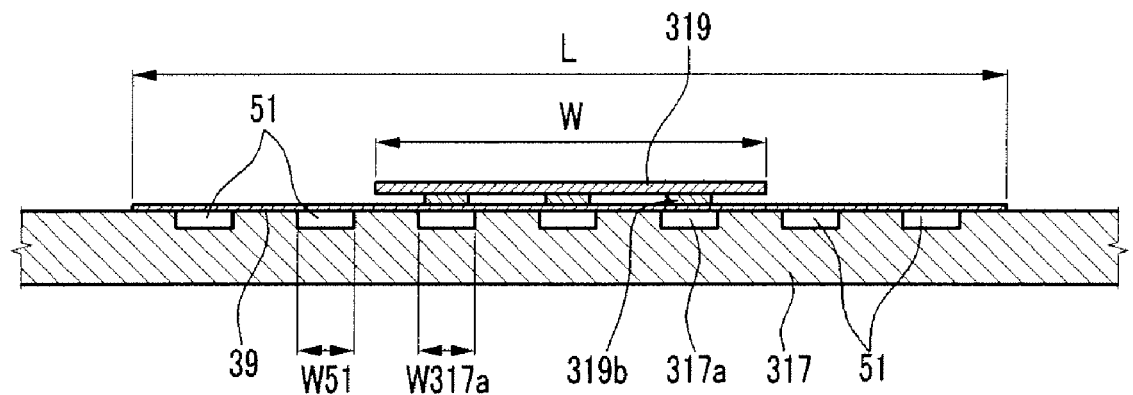
FIG. 4 is a cross-sectional view of the state before the FPC is pressed with the ACF placed on the PCB.
Figure 5:
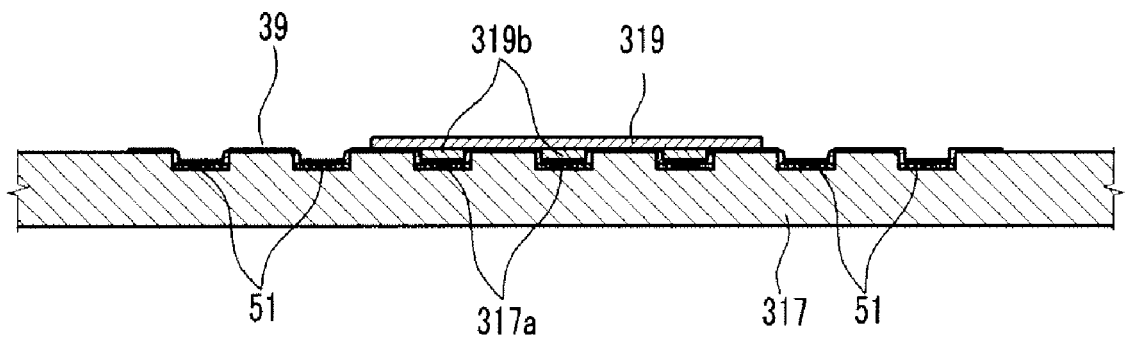
FIG. 5 is a cross-sectional view of the state after the FPC is pressed with the ACF placed on the PCB.

Referring now to FIGS. 3, 4 and 5, the ACF 39 is disposed between the third FPC 319 and the address buffer board 317 that face each other, and electrically connects the second terminals 319b of the third FPC 319 and the terminals 317a of the address buffer board 317.

The address buffer board 317 includes a plurality of terminals 317a and dummy grooves 51 formed outside the regions facing the third FPC 319.

In the case that the third FPC 319 is attached to the address buffer board 317, the ACF 39 is disposed on the terminals 317a of the address buffer board 317 (as in FIGS. 3 and 4), and then the third FPC 319 is pressed by a press tool (not shown) (as in FIG. 5).

The dummy grooves 51 allow the ACF 39 to receive a uniform pressing force throughout the regions having the terminals 317a (the regions facing the third FPC) and the regions having no terminals 317a (the regions outside the regions facing the third FPC).

The dummy grooves 51 may be formed in various structures and at various positions around the terminals 317a of the address buffer board 317.

For better comprehension and ease of description, and more specifically, referring to FIG. 4, the third FPC 319 forms a width W along the terminal spacing direction of the second terminals 319a and a length between the first terminals 319a and the second terminals 319b. The ACF 39 has a length L that is greater than the width W of the third FPC 319.

One side of the longitudinal (L) direction of the ACF 39 is attached at least to the dummy grooves 51. The ACF 39 is attached to the address buffer board 317, facing the third FPC 319, and is also attached to the address buffer board 317 even in the regions not facing the third FPC 319.

While the ACF 39 is attached to the terminals 317a of the address buffer board 317 in the regions facing the third FPC 319, the ACF 39 is attached to the dummy grooves 51 of the address buffer board 317 in the regions not facing the third FPC 319.

For example, the width W51 of the dummy grooves 51 is the same as the width W317a of the terminals 317a. Therefore, the ACF 39 is attached to the address buffer board 39 in the same structure in the terminals 317a and the dummy grooves 51, and the third FPC 319 maintains a uniform attachment force in the address buffer board 317.

Referring back to FIG. 3, the terminals 317a of the address buffer board 317 are formed at least as a first terminal set ST1 and a second terminal set ST2 thereof along the x-axis direction in the PDP 11 so as to correspond to a plurality of third FPCs 319.

Multiple dummy grooves 51 are formed between the first terminal set ST1 and the second terminal set ST2. The ACF 39 maintains a uniform attachment force at both sides of the first terminal set ST1 or the second terminal set ST2.

The dummy grooves 51 may be formed with a small width that is identical to the width W317a of the terminals 317a of the third FPC 317, and may have a larger width than the width S317a of the terminals 317a.

Figure 6:
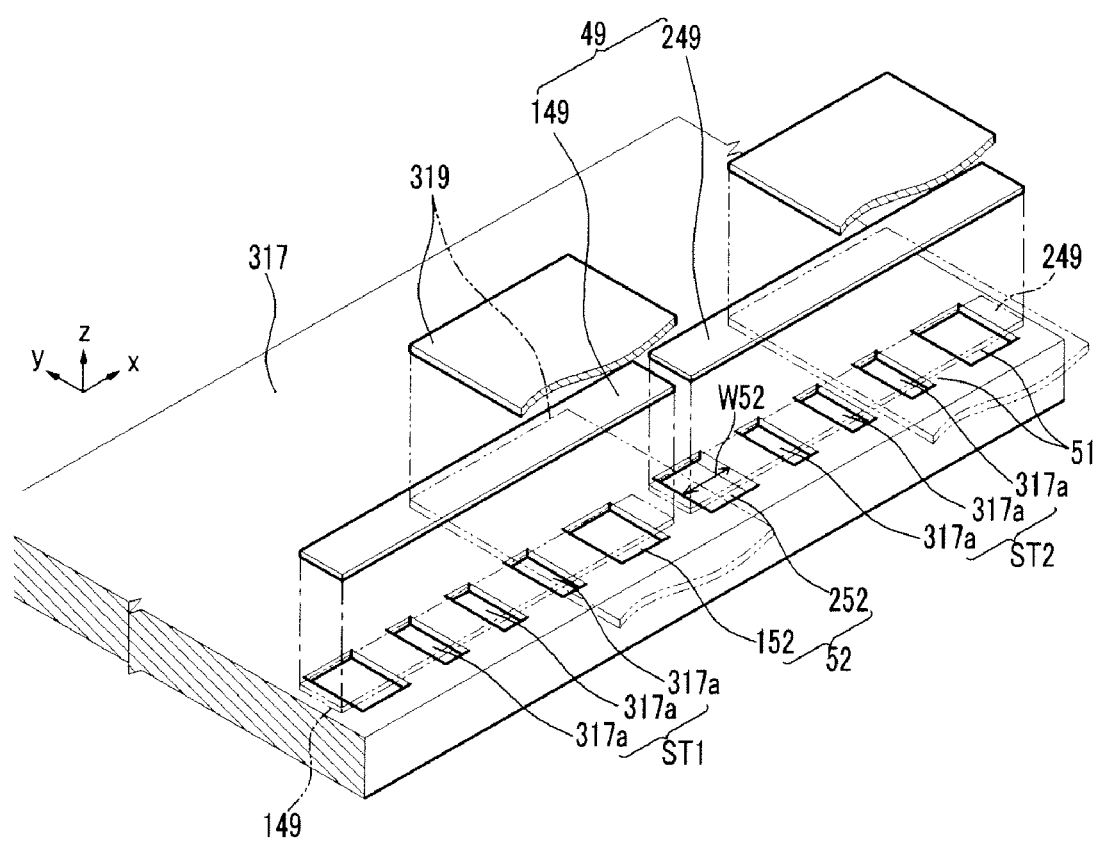
FIG. 6 is an exploded perspective view of a PCB, an ACF, and an FPC in a plasma display device in accordance with a second exemplary embodiment of the present invention.

In FIGS. 3 to 5, the dummy grooves 51 showed an example of small width dummy grooves. FIG. 6 shows an example of large width dummy grooves. The small width dummy grooves and the large width dummy grooves may be formed together on the same third PCB (not shown).

FIG. 6 is an exploded perspective view of a PCB, an ACF, and an FPC in a plasma display device in accordance with a second exemplary embodiment of the present invention.

The second exemplary embodiment includes the same or similar components as those of the first exemplary embodiment. Thus, the detailed descriptions of the same or similar parts are omitted and the different parts are described.

The large width dummy grooves 52 have a larger width W52 than the width of the terminals 317a. In addition, the large width dummy grooves 52 include first large width dummy grooves 152 and second large width dummy grooves 252 that are formed between the first terminal set ST1 and the second terminal set ST2, neighboring the first terminal set ST1 and the second terminal set ST2.

To correspond to these, an ACF 49 includes a first ACF 149 corresponding to the first terminal set ST1 and a second ACF 249 corresponding to the second terminal set ST2.

Neighboring ends of the first ACF 149 and the second ACF 249 are positioned between the first large width dummy grooves 152 and the second large width dummy grooves 252, respectively. One side of the first ACF 149 is attached to the first large width dummy grooves 152, and one side of the second ACF 249 is attached to the second large width dummy grooves 252.

Therefore, when the second terminals 319b of the third FPC 319 are connected to the terminals 317a of the address buffer board 317 by pressing the third FPC 319, the ACF 49 may be pressed without any deviation of the press tool even in the regions to which the third FPC 319 is not attached.

Figure 7:
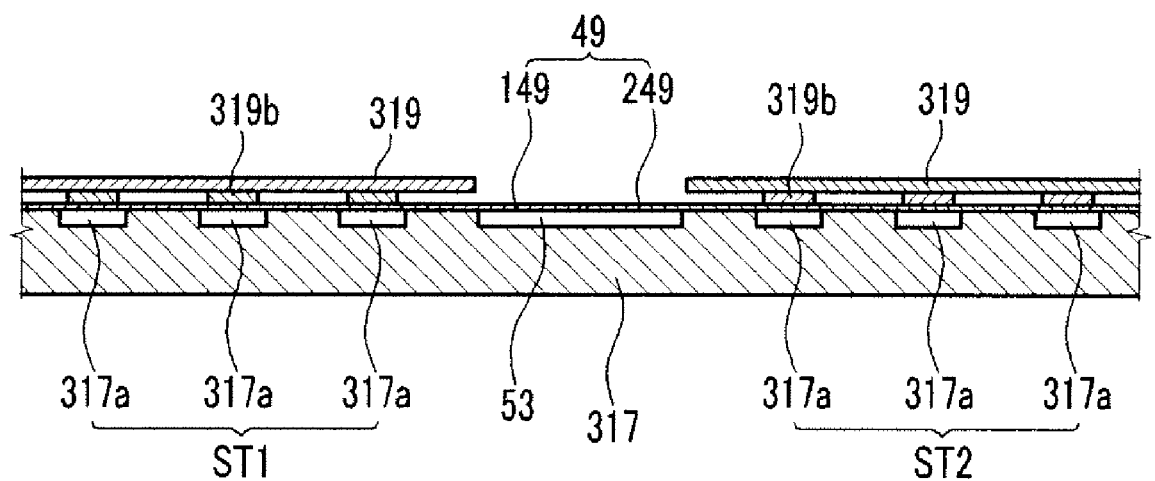
FIG. 7 is a cross-sectional view of a PCB, an ACF, and an FPC in a plasma display device in accordance with a third exemplary embodiment of the present invention.

FIG. 7 is a cross-sectional view of a PCB, an ACF, and an FPC in a plasma display device in accordance with a third exemplary embodiment of the present invention.

The third exemplary embodiment includes the same or similar components as those of the first exemplary embodiment. Thus, the detailed descriptions of the same or similar parts are omitted and the different parts are described.

The third exemplary embodiment illustrates an integral dummy groove 53. The integral dummy groove 53 is formed integrally between the first terminal set ST1 and the second terminal set ST2.

Neighboring ends of the first ACF 149 and the second ACF 249 are positioned at the integral dummy groove 53, respectively.

Accordingly, when the second terminals 319b of the third FPC 319 are connected to the terminals 317a of the address buffer board 317 by pressing the third FPC 319, the ACF 49 may be pressed without any deviation of the press tool even in the regions to which the third FPC 319 is not attached.

In addition, the facing ends of the first ACF 149 and the second ACF 249 are attached to each other by being uniformly pressed at the integral dummy groove 53.

The foregoing description has been made about the structure for connecting the address buffer board 317 and the third FPC 319. The structure for connecting the sustain board 217 and the sustain electrodes 31 and the structure for connecting the scan board 317 and the scan electrodes 32 can be applied in the same manner as in the structure for connecting the address buffer board 317 and the third FPC 319.

Accordingly, the structure for connecting the address buffer board 317 and the third FPC 319, the structure for connecting the sustain board 217 and the sustain electrodes 31 and the structure for connecting the scan board 317 and the scan electrodes 32 can be sufficiently understood similarly by referring to FIGS. 1 to 7.

However, the present invention is not limited thereto. Thus, an embodiment where at least one FPC and at least one PCB connected to the same has the above connection structure is included in the present invention.

In the first to third exemplary embodiments, a detailed description of the structure for connecting the sustain board 217 and the sustain electrodes 31 and the structure for connecting the scan board 317 and the scan electrodes 32 is omitted because the description thereof only involves the substitution of the types of electrodes and the substitution of the types of boards.

In the plasma display device in accordance with one exemplary embodiment of the present invention, at least one dummy grooves are formed on PCBs in regions outside the regions facing FPCs, and an ACF is disposed between the PCBs and the FPCs, thereby connecting terminals of the FPCs to terminals of the PCBs.

Therefore, when the second terminals of the FPCs are connected to the terminals of the PCB by pressing the FPCs, the ACF may be pressed without any deviation of the press tool even in the regions to which the third FPCs are not attached.

In the ACF, the regions facing the FPCs are attached to the terminals of the PCBs, and the regions outside the regions facing the FPCs are attached to the dummy grooves of the PCBs.

In other words, the ends of the ACF are attached to the PCBs in the same structure as the regions facing the FPCs (that is, the entire ACF is attached to the PCBs in the same structure), and hence the reliability of connection between the terminals of the PCBs and the terminals of the FPCs can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device, comprising:
a plasma display panel for displaying an image;
a chassis base having a first side attached to and supporting the plasma display panel;
at least one printed circuit board mounted on a second side of the chassis base opposite the first side;
at least one flexible printed circuit for connecting electrodes of the plasma display panel and a terminal of the at least one printed circuit board; and
an anisotropic conductive film between the terminal of the at least one printed circuit board and a terminal of the at least one flexible printed circuit and connecting the terminal of the at least one printed circuit board with the terminal of the at least one flexible printed circuit,
wherein the at least one printed circuit board comprises a plurality of grooves, the plurality of grooves comprising at least one terminal groove corresponding to the terminal of the at least one printed circuit board, the at least one terminal groove being in a region of the printed circuit board overlapping the at least one flexible printed circuit, and at least one dummy groove, wherein the at least one dummy groove is not overlapped with at least one flexible printed circuit.

2. The plasma display device of claim 1, wherein:
the at least one flexible printed circuit has a width along a terminal spacing direction of the terminal of the at least one flexible printed circuit;
the anisotropic conductive film has a length greater than the width of the at least one flexible printed circuit; and
one side of the anisotropic conductive film is attached at least to the at least one dummy groove.

3. The plasma display device of claim 2, wherein:
the at least one flexible printed circuit comprises a plurality of flexible printed circuits;
the terminal of the at least one printed circuit board includes at least a first terminal set and a second terminal set corresponding to respective ones of the plurality of flexible printed circuits; and
the at least one dummy groove includes an integral dummy groove formed integrally between the first terminal set and the second terminal set.

4. The plasma display device of claim 3, wherein the anisotropic conductive film comprises:
a first anisotropic conductive film on the first terminal set; and
a second anisotropic conductive film on the second terminal set,
wherein neighboring ends of the first anisotropic conductive film and the second anisotropic conductive film are at the integral dummy groove.

5. The plasma display device of claim 1, wherein:
the plasma display panel comprises address electrodes and display electrodes crossing each other;
the display electrodes comprise sustain electrodes and scan electrodes parallel to each other;
the electrodes connected to the at least one flexible printed circuit are the address electrodes;
the at least one printed circuit board is an address buffer board; and
the at least one flexible printed circuit is a tape carrier package.

6. The plasma display device of claim 1, wherein:
the plasma display panel comprises address electrodes and display electrodes crossing each other;
the display electrodes comprise sustain electrodes and scan electrodes parallel to each other;

the electrodes connected to the at least one flexible printed circuit are the sustain electrodes or the scan electrodes; and the at least one printed circuit board is a sustain board connected to the sustain electrodes or a scan board connected to the scan electrodes.

7. A plasma display device, comprising:

a plasma display panel for displaying an image;

a chassis base having a first side attached to and supporting the plasma display panel;

at least one printed circuit board mounted on a second side of the chassis base opposite the first side;

at least one flexible printed circuit for connecting electrodes of the plasma display panel and a terminal of the at least one printed circuit board; and an anisotropic conductive film between the terminal of the at least one printed circuit board and a terminal of the at least one flexible printed circuit and connecting the terminal of the at least one printed circuit board with the terminal of the at least one flexible printed circuit, wherein the at least one printed circuit board comprises at least one dummy groove that is not overlapped with the at least one flexible printed circuit, and wherein the at least one dummy groove has a same width as a width of the terminal of the at least one printed circuit board.

8. The plasma display device of claim 7, wherein:

the at least one flexible printed circuit comprises a plurality of flexible printed circuits;

the terminal of the at least one printed circuit board includes at least a first terminal set and a second terminal set corresponding to respective ones of the plurality of flexible printed circuits; and the at least one dummy groove comprises a plurality of dummy grooves between the first terminal set and the second terminal set.

9. A plasma display device, comprising:

a plasma display panel for displaying an image;

a chassis base having a first side attached to and supporting the plasma display panel;

at least one printed circuit board mounted on a second side of the chassis base opposite the first side;

at least one flexible printed circuit for connecting electrodes of the plasma display panel and a terminal of the at least one printed circuit board; and an anisotropic conductive film between the terminal of the at least one printed circuit board and a terminal of the at least one flexible printed circuit and connecting the terminal of the at least one printed circuit board with the terminal of the at least one flexible printed circuit, wherein the at least one printed circuit board comprises at least one dummy groove that is not overlapped with the at least one flexible printed circuit, and wherein the at least one dummy groove includes at least one of a small width dummy groove having a same width as a width of the terminal of the at least one printed circuit board, and a large width dummy groove having a width greater than the width of the terminal of the at least one printed circuit board.

10. The plasma display device of claim 9, wherein:

the at least one flexible printed circuit comprises a plurality of flexible printed circuits;

the terminal of the at least one printed circuit board includes at least a first terminal set and a second terminal set corresponding to respective ones of the plurality of flexible printed circuits; and the large width dummy groove includes a first large width dummy groove and a second large width dummy groove between the first terminal set and the second terminal set.

11. The plasma display device of claim 10, wherein the anisotropic conductive film comprises:

a first anisotropic conductive film on the first terminal set; and a second anisotropic conductive film on the second terminal set, wherein neighboring ends of the first anisotropic conductive film and the second anisotropic conductive film are between the first large width dummy groove and the second large width dummy groove.

* * * * *

UNITED STATES PATENT AND TRADEMARK OFFICE
CERTIFICATE OF CORRECTION

PATENT NO.        : 8,143,785 B2                               Page 1 of 1
APPLICATION NO.   : 12/398091
DATED             : March 27, 2012
INVENTOR(S)       : Tae-Kyoung Kang It is certified that error appears in the above-identified patent and that said Letters Patent is hereby corrected as shown below:

In the Claims

Column 8, line 23, Claim 1               Delete "with at least"; Insert -- with the at least --

Signed and Sealed this
Twenty-third Day of April, 2013

Teresa Stanek Rea
*Acting Director of the United States Patent and Trademark Office*